United States Patent
Chen et al.

(10) Patent No.: US 6,555,405 B2
(45) Date of Patent: Apr. 29, 2003

(54) METHOD FOR FORMING A SEMICONDUCTOR DEVICE HAVING A METAL SUBSTRATE

(75) Inventors: Nai-Chuan Chen, Pan-Chiao (TW); Bor-Jen Wu, Taipei (TW); Yuan-Hsin Tzou, Kaohusiung (TW); Nae-Guann Yih, Tao-Yuan (TW); Chien-An Chen, Hsin-Chuang (TW)

(73) Assignee: Uni Light Technology, Inc. (TW)

( * ) Notice: Subject to any disclaimer, the term of this patent is extended or adjusted under 35 U.S.C. 154(b) by 0 days.

(21) Appl. No.: 09/933,642

(22) Filed: Aug. 21, 2001

(65) Prior Publication Data

US 2002/0137244 A1 Sep. 26, 2002

Related U.S. Application Data

(63) Continuation-in-part of application No. 09/814,412, filed on Mar. 22, 2001.

(51) Int. Cl.[7] .............................................. H01L 21/20
(52) U.S. Cl. .......................... 438/22; 438/33; 438/459; 438/977
(58) Field of Search ............................... 438/22, 24, 29, 438/33, 46, 455, 458, 459, 977, 464

(56) References Cited

U.S. PATENT DOCUMENTS 6,091,085 A * 7/2000 Lester ............................ 257/98
6,287,882 B1 * 9/2001 Chang et al. .................. 438/29

* cited by examiner

Primary Examiner—Savitri Mulpuri
(74) Attorney, Agent, or Firm—Powell Goldstein Frazer & Murphy LLP

(57) ABSTRACT

The present invention provides a method for forming a semiconductor device with a metal substrate. The method includes providing at least one semiconductor substrate; forming at least one semiconductor layer on the semiconductor substrate; forming the metal substrate on the semiconductor substrate and then removing the semiconductor substrate. The metal substrate has advantages of high thermal and electrical conductivity that can improve the reliability and lifetime of the semiconductor device.

15 Claims, 5 Drawing Sheets

METHOD FOR FORMING A SEMICONDUCTOR DEVICE HAVING A METAL SUBSTRATE

This is a continuation-in-part of U.S. patent application Ser. No. 09/814,412, filed Mar. 22, 2001.

BACKGROUND OF THE INVENTION

1. Field of the Invention

The invention relates to a method and structure for semiconductor devices, and more particularly to a method and structure for optical semiconductor devices.

2. Description of the Prior Art

Semiconductor devices are employed in a wide variety of electrical applications, for example, in central processors, memory devices, microwave devices, and light emitting devices.

Considering the amount of heat generated by a semiconductor device, this can heat up the device and, as a result, lead to a reduction in device lifetime and reliability. In addition, for optical semiconductor devices, such as light emitting diode (LED), edge emitting laser, or vertical cavity surface emitting laser, the light emitting efficiency can also be greatly reduced. In case of AlGaInP-based LED, the light is emitted via the direct bandgap recombination of electrons at $\Gamma$ with holes. At increased device temperatures, a substantial amount of electrons can transfer to $X$ band and then indirectly be combined with holes along with the generation of heat and as a result, the device internal quantum efficiency becomes lower. Consequently, the light emitting efficiency is reduced as the temperature becomes higher.

Many conventional light-emitting diodes (LEDs) are grown on a substrate having an energy gap smaller than that of the light emitting layer of the LED. The substrate can absorb some of the light generated within the active region, thereby reducing the efficiency of the device. An example of a prior art AlGaInP LED of the double heterojunction type is shown in FIG. 1. A layer 112 of n-type $(Al_xGa_{1-x})_{0.5}In_{0.5}P$, a light generation layer 114 of $(Al_xGa_{1-x})_{0.5}In_{0.5}P$ and a layer 116 of p-type $(Al_xGa_{1-x})_{0.5}In_{0.5}P$ are epitaxially grown on an n-type substrate 110 where "x" represents the chemical composition of Al. A double heterojunction structure as a region of light emitting are formed between layers 112–116. An optically transparent current spreading layer 118 of p-type $Al_xGa_{1-x}As$ or GaP is grown on the layer 116. The optically transparent current spreading layer 118 enhances lateral electrical conductivity a of p-type region and further improves current spreading on the double heterojunction structure. The amount of "x" in the light generation layer 114 determines the wavelength of light emitting. The bandgaps of the epitaxial layer 112, 116, and the optically transparent current spreading layer 118 are chosen so that the emitted lights will not be absorbed by these layers. However, the GaAs substrate 110 does absorb visible light. In this case, the efficiency of the light emitting device is greatly reduced because a substantial amount of downward emitted light is absorbed by the substrate.

Currently, there are several techniques for resolving the problem of light absorption by the substrate. A first technique is to grow the light-emitting devices on a non-absorbing substrate. However, the choice of accepted substrate can be quite limited, since the lattice constant of the substrate has to be very close to that of the epilayer, if not the same. A second technique is to grow a distributed Bragg reflector (DBR) between the LED epitaxial layers and the substrate. However, the improvement is limited because the distributed Bragg reflector only reflects light that is of near normal incidence. A significant amount of light that deviates from a normal incidence can pass through the DBR toward the substrate, where it is absorbed.

The third technique is to grow the LED epitaxial layers on a temporary substrate, which can be an absorbing one and is removed after epitaxy. In this case, a thick, optically transparent and electrically conductive transparent "substrate" is grown on the temporary substrate as the permanent one and is followed by a light emitting structure. The temporary substrate is then removed by a method of polishing, etching, or wafer lift-off. The resultant wafers are thin and fragile. Therefore, a rather thick epitaxially-grown permanent substrate is required. However, a "thick" transparent substrate requires a long growth time, and thus, the manufacturing throughput of such LEDs is low and the cost remains high.

Another concern of the LED performance is the current distribution. For example as depicted in FIG. 2, an n-type ohmic contact 130 that contains a composition of Au/Ge is made at the back of an n-type substrate 132; a light emitting layer 134 is on the n-type substrate 132, which can be a structure of single or double heterojunction, or a structure of multiple-quantum well; a p-type transparent current spreading layer 136 is grown on the light emitting layer 134. A bonding pad 138 of p-type ohmic contact generally contains a composition of Au/Be or Au/Zn. As current travels from the bonding pad 138 to the p-type transparent current spreading layer 136, part of the current travels laterally within the p-type transparent current spreading layer 136 and then downward through the light emitting layer 134 and emits light. On the other hand, part of the current travels directly downward from the bonding pad 138 through the p-type transparent current spreading layer 136 and the light emitting layer 134 and emits light. However, in such case the upward emitted light is blocked by the bonding pad 138 and cannot escape from the device. Therefore, this part of the current is regarded as ineffective current and should be minimized. To prevent this, a current blocking structure right below the bonding pad such that the current cannot pass directly downward to the light emitting layer 134 is necessary. One commonly used approach, based on an n-type substrate structure, is shown in FIG. 3. A current blocking structure 140 of n-type layer, whose conductivity is different from that of the transparent current spreading layer 136, is utilized to achieve the effect of current blocking. There are two methods of fabricating such a current blocking structure 140. Firstly, a two-step epitaxy method is used. It is to grow in sequence the light emitting layer 134 and then the current blocking layer and on the substrate 132. The epi-wafer is then removed from the growth chamber and the current blocking layer is etched to form the current blocking 140 structure of n-type layer. The processed wafer is put back to the growth chamber for the growth of the transparent current spreading layer 136. However, in this case, the epitaxy chamber is susceptible to pollution that can adversely affect the properties of epitaxial layers. A second method is to utilize localized selective diffusion. Though this process is simple and low cost, it is difficult to control.

SUMMARY OF THE INVENTION

It is an object of the present invention to provide a method for forming a metal substrate to replace the conventional semiconductor substrate. The reliability and lifetime of a semiconductor device can be enhanced by the high thermal and electrical conductivity of the metal substrate. In addition, the metal substrate can also enhance the efficiency of light output for an optical semiconductor device.

Another object of the present invention is to provide a method for forming a mirror-like or a rough surface between the metal substrate and the semiconductor layers for a light-emitting device. This surface may be formed by a metal/semiconductor interface or by utilizing differences of refractive index. This surface can redirect the downward emitted lights to and escape from the surface of the device so as to enhance the efficiency of emitting light.

It is yet an object of the present invention to provide a technique of a metal substrate such that current blocking layer below the light emitting layer is provided to block current and to enhance the efficiency of light emitting.

It is yet another object of the present invention to provide a method for forming a metal substrate as a temporary substrate whereby thin layers of semiconductor may be removed for other applications.

In the present invention, a method for forming a semiconductor device with a metal substrate is disclosed. The method includes providing at least using one semiconductor substrate as the temporary substrate; forming at least one semiconductor layer on the semiconductor substrate; forming a metal substrate on the semiconductor substrate and then removing the semiconductor substrate. The metal substrate has advantages of high thermal and electrical conductivity that can improve the reliability and lifetime of the semiconductor device.

BRIEF DESCRIPTION OF THE DRAWINGS

A better understanding of the invention may be derived by reading the following detailed description with reference to the accompanying drawings wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of preferred embodiment, those skilled in the art will recognize that many steps and materials described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a method for forming a semiconductor device with a metal substrate is disclosed. The method includes providing at least one semiconductor substrate as the temporary substrate; forming at least one semiconductor layer on the semiconductor substrate; forming a metal substrate on the semiconductor substrate and then removing the semiconductor substrate. The metal substrate has advantages of high thermal and electrical conductivity that can improve the reliability and lifetime of the semiconductor device.

Figure 1:
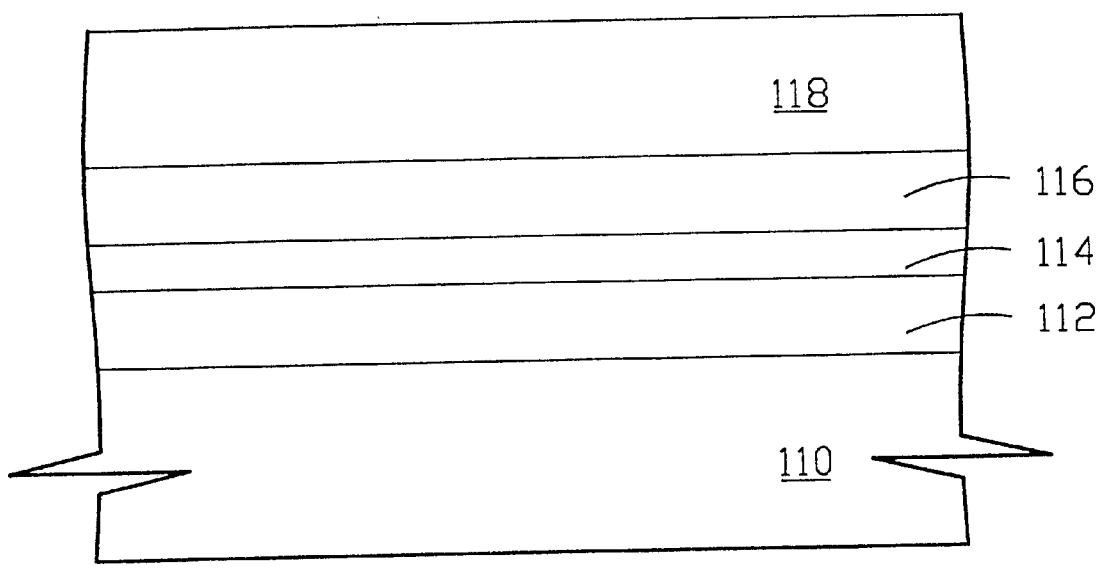
FIG. 1 is a cross-sectional view illustrating a light emitting diode in accordance with the prior art.
Figure 2:
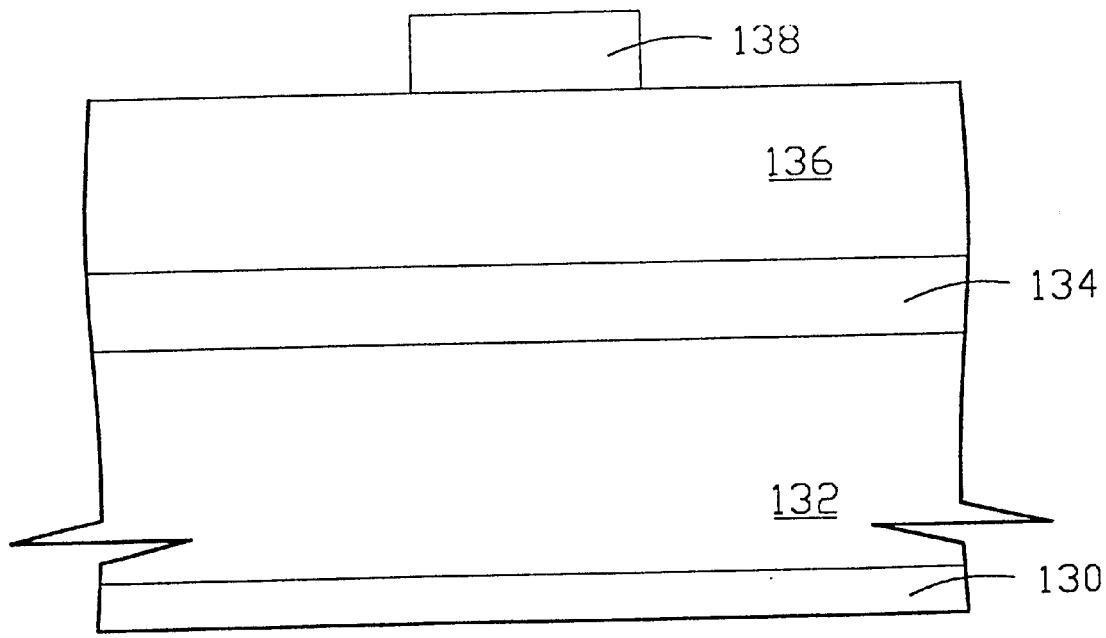
FIG. 2 is a cross-sectional view illustrating a light emitting diode including a bonding pad in accordance with the prior art.
Figure 3:
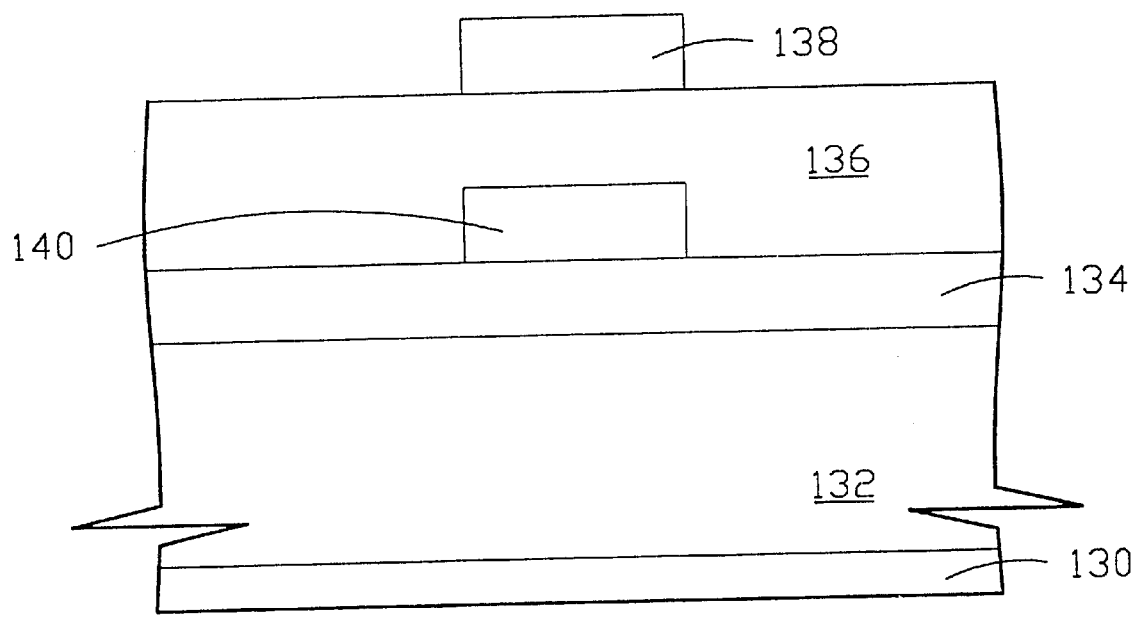
FIG. 3 is a cross-sectional view illustrating a light emitting diode including a current blocking layer in accordance with the prior art.
Figure 4:
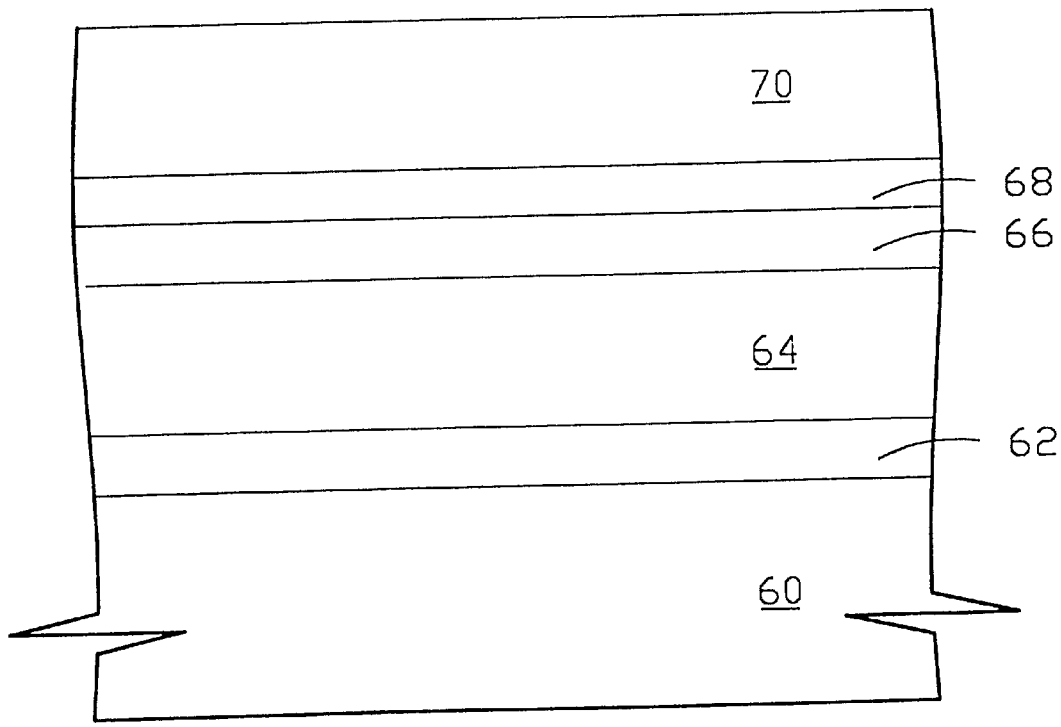
FIG. 4 is a cross-sectional view illustrating a light emitting diode having a thick metal layer in accordance with the present invention.

With reference to FIG. 4, a first step in carrying out the invention is to select a substrate 60 onto which a plurality of LED layers will be sequentially grown. In the present invention, the substrate 60 is a temporary substrate which will be removed later during the fabrication of the LED layers. Therefore, the substrate 60 can be selected from a great variety of substrates as long as it can lead to high quality LED epitaxy. The substrate 60 can be n-type, p-type, semi-insulated, optically transparent, or optically absorptive. Because of its low defect density and lattice matched to AlGaInP-based LED, though it can absorb visible light, n-type GaAs is commonly used as the substrate. The LED layer 64, and 66 are then grown on the substrate 60. The layer 64 is a double heterojunction structure. It should be noted that the invention can be applicable to other types of LED devices.

The epitaxial layer 62 directly above the substrate 60 is an optically transparent current spreading layer of n-type AlGaAs or AlGaInP. Grown above the layer 62 is an AlGaInP double heterojunction layer 64. The layer 66 above the layer 64 is a p-type layer. It can be a transparent layer, such as GaP, AlGaAs or AlGaInP, or a thin absorbing layer like GaAs, which can provide good ohmic contact for subsequent processes.

A metal ohmic electrode 68 is then made on the layer 66 after epitaxy growth is performed. The metal ohmic electrode 68 can be formed by providing a coating of an Au/Be or Au/Zn layer followed by a high-temperature annealing. However, for those semiconductor devices for which vertical conduction configuration is not used and for those ohmic contacts that can be directly formed between the metal substrate 70 and p-layer 66, the ohmic contact layer 68 can be omitted. Next, a key step of the present invention is to form a "thick" metal layer 70 as a permanent substrate. Compared with a semiconductor, the metal is less fragile, therefore a thickness of 20 μm or more should be enough to support the semiconductor films thereon. Nevertheless, the thickness of the metal layer may be also as thick as that of conventional semiconductor substrate.

There are many methods to form the thick metal layer as a metal substrate 70. For example, it can be formed by evaporation or sputtering of Au, Pt, Pd, Zn, Al, Ni, Ti, Cr, alloys of the above, or any combination of multi-layers of the above. Further, the metal substrate 70 can also be made by metal cold-forming that is applied on the metal ohmic electrode 68 on the surface of the epitaxial layers. The cold-forming metals can be In, Pb, Sn, or alloys of the above, etc. In addition, the cold-forming metals can be used as adhesives whereby other metal materials adhere to the metal ohmic electrode 68 or on the surface of epitaxial layers to form the metal substrate 70.

Furthermore, the metal substrate 70 may be electroplated on metal ohmic electrode 68 or on the surface of epitaxial layers that is used as a cathode during an electroplating process. The material for the metal substrate 70 may be Cu, Ni, Cr, Zn, Sn, Ag, or Au, etc. Using Cu as an example, the plating may be performed in an aqueous solution of copper sulfate and sulfuric acid. Cu is used as the anode and the ohmic contact or the surface of the epitaxial layer as the cathode. Thick Cu film can be formed immersing both anode and cathode into the plating solution with the application of DC current. Similarly for Ni plating, aqueous solution of nickel sulfate, nickel chloride, and boric acid is used as the plating solution and nickel is used as the anode. Furthermore, the method of electrodeless plating can be used to deposit the metal substrate 70 with material such as Cu, Ni, Au, Pt, or Pd. In this case, the metal atoms are derived from reduction of metal ions in a solution by the addition of reductant. Following formation of the metal substrate 70, the GaAs substrate 60 is removed by using selectively etching, lapping/polishing, or wafer lift-off.

Figure 5:
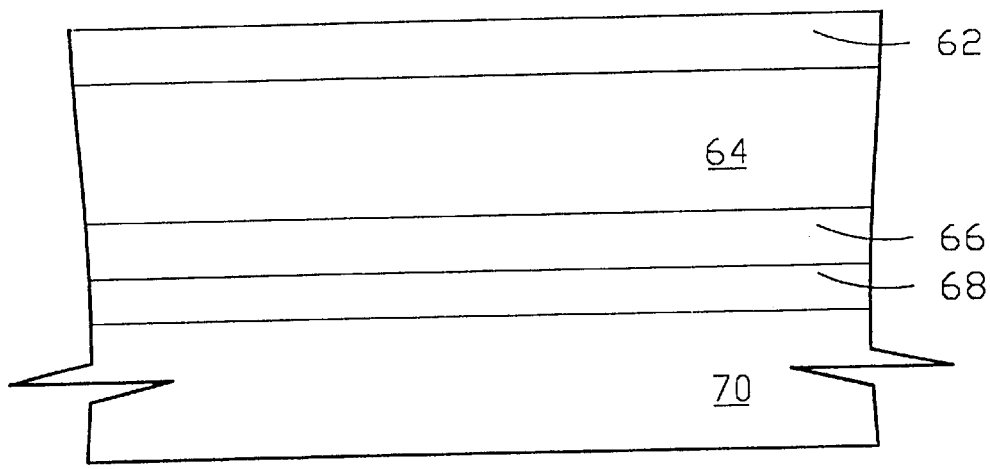
FIG. 5 is a cross-sectional view illustrating a light emitting diode using a thick metal substrate to replace a temporary substrate in accordance with the present invention.
Figure 6:
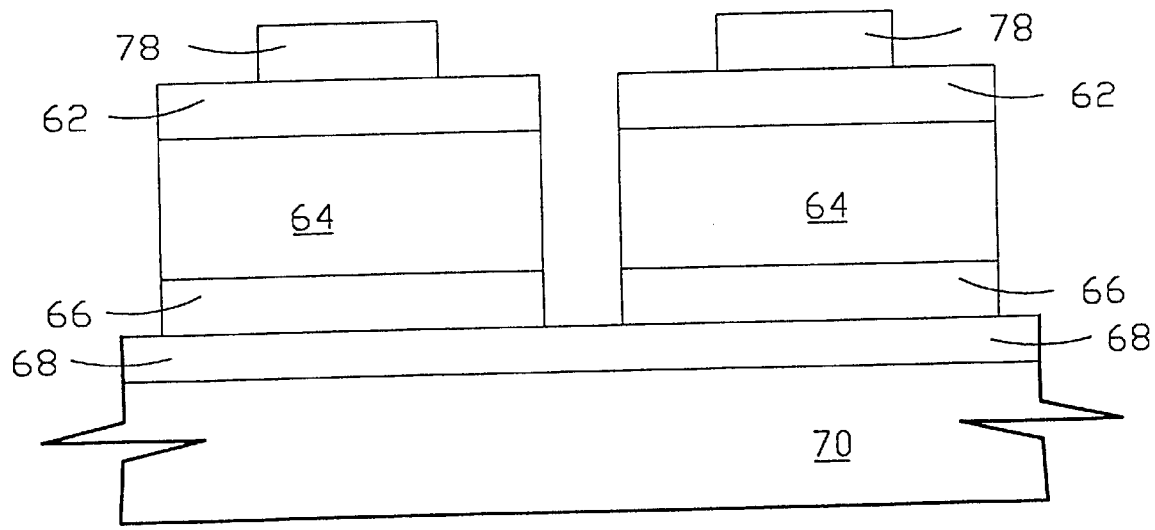
FIG. 6 is a cross-sectional view illustrating light emitting diodes including multiple bonding pads in accordance with the present invention.

The wafer is then flipped upside down as shown in FIG. 5. The structure of the wafer is similar to that of a conventional light emitting diode except that the metal substrate 70 is used as the substrate in the embodiment. Next, front ohmic bonding pads are made as shown in FIG. 6.

Figure 7:
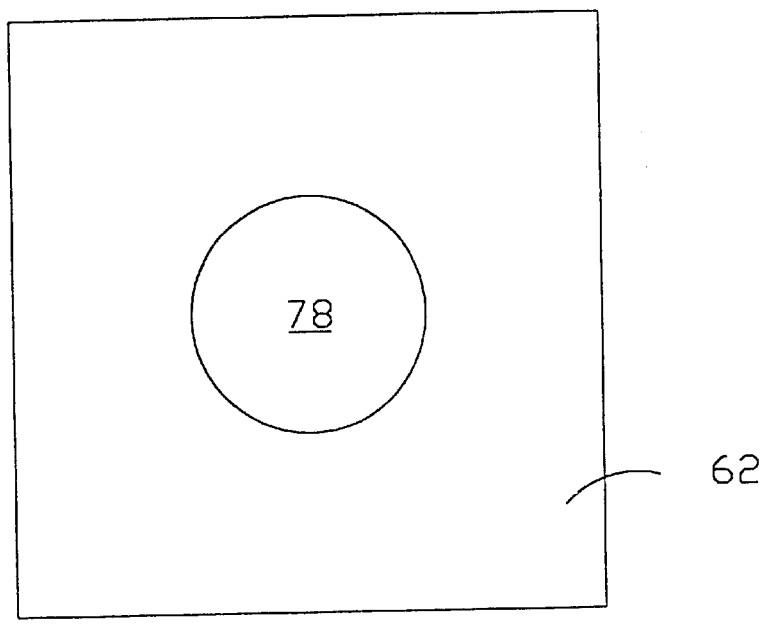
FIG. 7 is a top view illustrating a light emitting diode in accordance with the present invention.

Thereafter, a light emitting diode having a metal substrate is formed by cutting the wafer into multitudes of individual chips. A top view of each chip is shown in FIG. 7. The chip has an improved reliability because the metal substrate has higher thermal conductivity. Furthermore, the metal substrate can also improve the device color and light output stability.

Meanwhile, during operation, light emitted from double heterojunction layer (the layer 64 in FIG. 6) can be reflected by the interface between the metal ohmic electrode 68 and the p-type layer 66. It is likely that the reflective efficiency of the interface may become lower after the high-temperature annealing. In the embodiment, the reflectivity of the interface can be improved using ohmic contacts with lower annealing temperature or by inserting a Bragg reflector between the metal ohmic electrode 68 and the LED structure 64.

Furthermore, light-emitting efficiency may be increased by changing reflective direction. One way of doing it, for example, can be to intentionally roughen the interface between the metal ohmic electrode 68 and the layer 66 in FIG. 6 by polishing or other methods. Another method of increasing light-emitting efficiency is to utilize total reflection of the emitted light between the metal ohmic electrode 68 and the layer 66 in FIG. 6. This can be done by putting a non-absorbing interlayer having lower refracting index than that of the layer 66 placed between layer 66 and the metal ohmic electrode layer 68. A partial list of suitable materials includes $In_2O_3$, $SnO_2$, ITO, $HfO_2$, MgO, SiO ($SiO_2\square SiO_x$), TiO($TiO_2$, $TiO_x$, $Ti_2O_3$, $Ti_2O_5$), ZnO, ZnS, $Al_2O_3$, $Ta_2O_3$, and $Ta_2O_5$.

Figure 8:
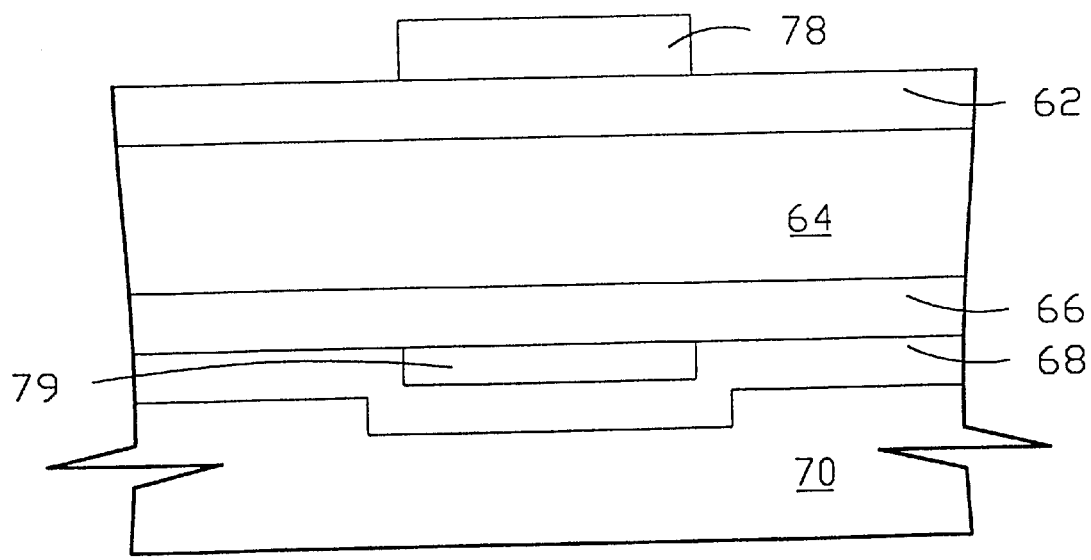
FIG. 8 is a cross-sectional view of an embodiment illustrating a light emitting diode including a current blocking layer in accordance with the present invention.

The light-emitting efficiency of the light emitting diode may be increased by utilizing current blocking. This can also be easily implemented with the metal substrate to form current blocking in the present invention. The first method is shown in FIG. 8, a current-blocking layer 79 can be formed between the p-type layer 66 and the metal ohmic electrode 68, and placed right below the bonding pad 78. The current-blocking layer 79 can be made by forming a semi-insulating layer, an insulating layer or a semiconductor layer with a different conduction type as that of layer 66 during the formation of the epitaxial layers. The current blocking layer can also be made by ion-implantation. In addition, the metal layer that cannot form ohmic contact with the layer 66 can also be used for the current blocking layer 79.

Figure 9:
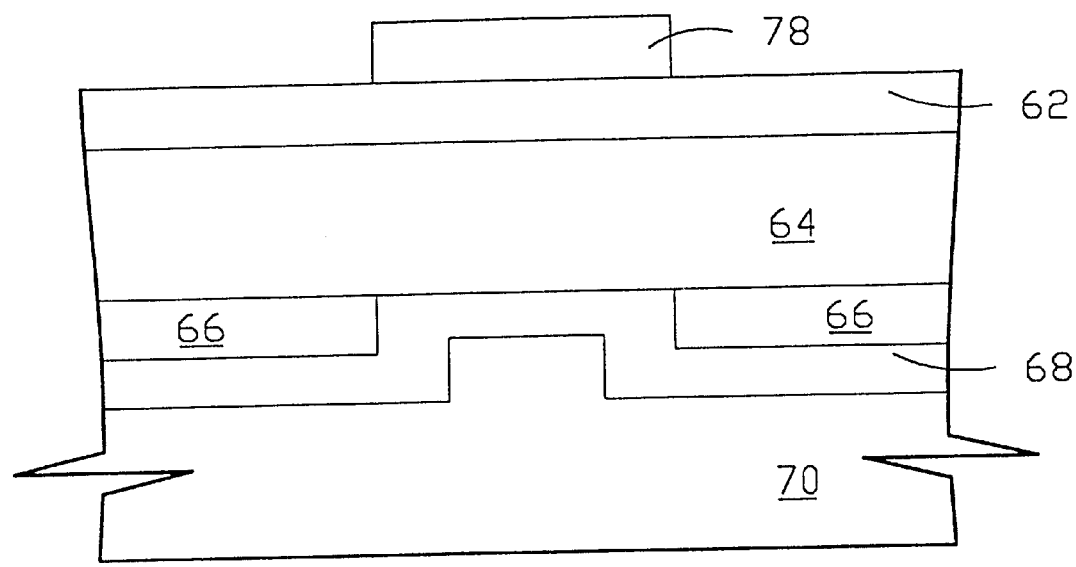
FIG. 9 is a cross-sectional view of another embodiment illustrating a light emitting diode including a current blocking layer in accordance with the present invention.

The second method of making the current blocking structure is shown in FIG. 9. The portion of layer 66 located right below the bonding pad 78 is removed, such that there is no ohmic contact formed between the layer 66 and the metal ohmic electrode 68 in the region right below the bonding pad 78. Considering all the techniques mentioned above, high current blocking efficiency can all be achieved and the efficiency of emitting light can be substantially improved.

Figure 10:
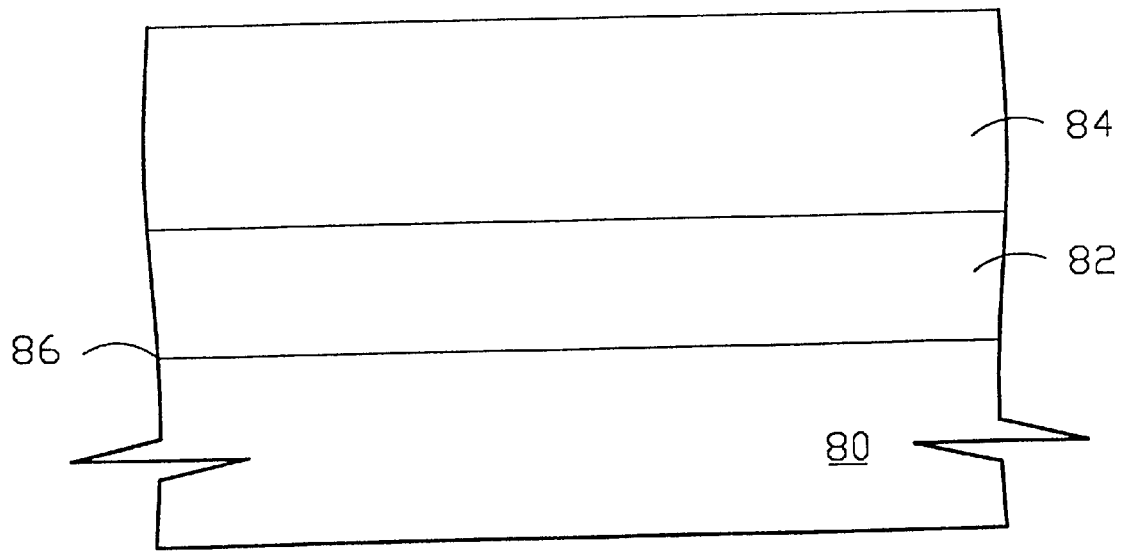
FIG. 10 is a cross-sectional view illustrating a light emitting diode having a metal substrate as a temporary substrate in accordance with the present invention.

It is likely that, using the metal substrate of this invention, the layer structure of the device is right opposite to that of the growth sequence. Therefore special care must be taken in device design. This can be easily resolved if the metal substrate technique is applied twice, and the first metal substrate is treated as a temporary substrate. As shown in FIG. 10, metal substrate 80 serves as a temporary substrate and layer 82 is a portion of the semiconductor structure removed from a semiconductor wafer. Note that the interface between layers 80 and 82 was the top surface of the semiconductor wafer. Metal substrate techniques of this invention can be applied once more on layer 82 and to from a permanent metal substrate layer 84. The temporary metal substrate 80 can then be removed. After turning the wafer up-side down, the wafer has the same structure as that of the original one, except that it is now on a metal substrate. It is clearly shown here that the metal substrate technique can also be used to separate a specific portion of a semiconductor structure of the original substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a light emitting diode with a metal substrate, said method comprising:
   providing a semiconductor substrate;
   forming an epitaxial layer on said semiconductor substrate, said epitaxial layer consisting of a plurality of semiconductor layers for forming light emitting diode;
   forming a metal ohmic electrode layer on said epitaxial layer;
   forming said metal substrate on said metal ohmic electrode layer;
   removing said semiconductor substrate; and
   forming a ohmic electrode bonding pad on said epitaxial layer.

2. The method according to claim 1, wherein said metal substrate is formed by the evaporation of a metal material, and said metal material is selected from the groups of Au, Pt, Pd, Zn, Al, Ni, Ti, Cr, single layer and alloys of the above, or multiple layers and alloys of the above.

3. The method according to claim 1, wherein said metal substrate is formed by the sputtering of a metal material, and said metal material is selected from the groups of Au, Pt, Pd, Zn, Al, Ni, Ti, Cr, single layer and alloys of the above, or multiple layers and alloys of the above.

4. The method according to claim 1, wherein said metal substrate is formed by fusing at least a cold-forming metal that subsequently is cast on said semiconductor layer, and said cold-forming metal is selected from the groups of In, Pb, Sn, single layer and alloys of the above, or multiple layers and alloys of the above.

5. The method according to claim 1, wherein said metal substrate is formed by fusing at least a cold-forming metal material with at least one other metal materials.

6. The method according to claim 1, wherein said metal substrate is formed by the electroplating of a metal material, and said metal material is selected from the groups of Cu, Ni, Cr, Zn, Sn, Ag, Au, single layer and alloys of the above, or multiple layers and alloys of the above.

7. The method according to claim 1, wherein said metal substrate is formed by the electrodeless electroplating of a metal material, and said metal material is selected from the groups of Cu, Ni, Au, Pt, Pd, single layer and alloys of the above, or multiple layers and alloys of the above.

8. The method according to claim 1 further comprising forming a distributed Bragg reflector between said epitaxial layer and said metal ohmic electrode layer, thereby enhances reflection and further enhances efficiency of light emitting.

9. The method according to claim 1 further comprising forming a non-absorbing layer covering whole or portion of a wafer between said epitaxial layer and said metal ohmic electrode layer, which has a refracting index smaller than that of said epitaxial layer and thereby enhances reflectivity and further enhances efficiency of light emitting, said non-absorbing layer is selected from the groups of $In_2O_3$, $SnO_2$, ITO, $HfO_2$, MgO, $SiO(SiO_2 \square SiO_x)$, $TiO(TiO_2, TiO_x, Ti_2O_3, Ti_2O_5)$, ZnO, ZnS, $Al_2O_3 Ta_2O_3$, and $Ta_2O_5$.

10. The method according to claim 1 further comprising forming a rough layer between said epitaxial layer and said metal ohmic electrode layer, thereby enhances upward reflection and further enhances efficiency of light emitting.

11. The method according to claim 1 further comprising locally forming a semi-insulating layer between said epitaxial layer and said metal ohmic electrode layer during the formation of said epitaxial layer, said semi-insulating layer positioned right above said ohmic electrode bonding pad and thereby blocks directly downward current and further enhances efficiency of light emitting.

12. The method according to claim 1 further comprising locally forming a semiconductor layer with a second conduction type between said epitaxial layer and said metal ohmic electrode layer during the formation of said epitaxial layer, said semiconductor layer with a second conduction type positioned right above said ohmic electrode bonding pad and thereby blocks directly downward current and further enhances efficiency of light emitting.

13. The method according to claim 1 further comprising locally forming a semi-insulating layer between said epitaxial layer and said metal ohmic electrode layer by the method of ion implantation, said semi-insulating layer positioned right above said ohmic electrode bonding pad and thereby blocks directly downward current and further enhances efficiency of light emitting.

14. The method according to claim 1 further comprising locally forming an insulating layer between said epitaxial layer and said metal ohmic electrode layer, said insulating layer positioned right above said ohmic electrode bonding pad and thereby blocks directly downward current and further enhances efficiency of light emitting.

15. The method according to claim 1 further comprising locally forming a non-ohmic contact metal region between said epitaxial layer and said metal ohmic electrode layer, said non-ohmic contact metal region positioned right above said ohmic electrode bonding pad and thereby blocks directly downward current and further enhances efficiency of light emitting.

* * * * *